US010818792B2

(12) United States Patent
Frougier et al.

(10) Patent No.: US 10,818,792 B2
(45) Date of Patent: Oct. 27, 2020

(54) NANOSHEET FIELD-EFFECT TRANSISTORS FORMED WITH SACRIFICIAL SPACERS

(71) Applicant: GLOBALFOUNDRIES Inc., Grand Cayman (KY)

(72) Inventors: Julien Frougier, Albany, NY (US); Ruilong Xie, Albany, NY (US); Daniel Chanemougame, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 18 days.

(21) Appl. No.: 16/106,291

(22) Filed: Aug. 21, 2018

(65) Prior Publication Data

US 2020/0066894 A1    Feb. 27, 2020

(51) Int. Cl.
*H01L 29/78* (2006.01)
*H01L 29/06* (2006.01)
(Continued)

(52) U.S. Cl.
CPC ...... *H01L 29/785* (2013.01); *H01L 21/76837* (2013.01); *H01L 21/823412* (2013.01); *H01L 21/823431* (2013.01); *H01L 21/823468* (2013.01); *H01L 29/0673* (2013.01); *H01L 29/0847* (2013.01); *H01L 29/6656* (2013.01);
(Continued)

(58) Field of Classification Search
CPC ............... H01L 29/785; H01L 29/0673; H01L 29/6656; H01L 29/66545; H01L 29/0847; H01L 29/6681; H01L 21/823431; H01L 21/76837; H01L 21/823468; H01L 21/823412; H01L 29/42392
See application file for complete search history.

(56) References Cited

U.S. PATENT DOCUMENTS 7,871,926 B2    1/2011  Xia et al.
10,424,639 B1 *  9/2019  Miao ................... H01L 29/7853
(Continued)

OTHER PUBLICATIONS

Taiwan Intellectual Property Office, Examination Report received in Taiwanese Patent Application No. 108125638 dated Mar. 10, 2020.

*Primary Examiner* — Bilkis Jahan
*Assistant Examiner* — Victor V Barzykin
(74) *Attorney, Agent, or Firm* — Thompson Hine LLP; Anthony Canale (57) ABSTRACT

Structures for a field-effect transistor and methods of forming structures for a field-effect transistor. A layer stack includes nanosheet channel layers arranged to alternate with sacrificial layers. First and second gate structures are formed that extend across the layer stack and that are separated by a first gap. First and second sidewall spacers are formed over the layer stack and within the first gap respectively adjacent to the first and second gate structures, and the layer stack is subsequently etched to form first and second body features that are separated by a second gap. The sacrificial layers are recessed relative to the nanosheet channel layers to define indents in the first and second body features, and the first and second sidewall spacers are subsequently removed. After removing the first and second sidewall spacers, a conformal layer is deposited in the second gap that fills the indents to define inner spacers.

12 Claims, 7 Drawing Sheets

(51) Int. Cl.
    *H01L 29/08*      (2006.01)
    *H01L 29/66*      (2006.01)
    *H01L 21/768*     (2006.01)
    *H01L 21/8234*    (2006.01)

(52) U.S. Cl.
    CPC .... *H01L 29/6681* (2013.01); *H01L 29/66545* (2013.01)

(56) References Cited

U.S. PATENT DOCUMENTS

| | | |
|---|---|---|
| 2006/0049826 A1 | 3/2006 | Daneman et al. |
| 2007/0121249 A1 | 5/2007 | Parker |
| 2011/0176037 A1 | 7/2011 | Benkley, III |
| 2012/0094456 A1* | 4/2012 | Wang ................. H01L 29/0649 438/285 |
| 2015/0076606 A1 | 3/2015 | Cheng et al. |
| 2018/0090624 A1 | 3/2018 | Cheng et al. |
| 2018/0114834 A1 | 4/2018 | Cheng et al. |

* cited by examiner

NANOSHEET FIELD-EFFECT TRANSISTORS FORMED WITH SACRIFICIAL SPACERS

BACKGROUND

The present invention relates to semiconductor device fabrication and integrated circuits and, more specifically, to structures for a field-effect transistor and methods of forming a structure for a field-effect transistor.

Device structures for a field-effect transistor generally include a source, a drain, and a gate electrode configured to switch carrier flow in a channel formed in a semiconductor layer arranged between the source and drain. The semiconductor layer and channel of a planar field-effect transistor are arranged beneath the top surface of a substrate on which the gate electrode is supported. When a control voltage exceeding a designated threshold voltage is applied to the gate electrode, the horizontal flow of carriers in the channel produces a device output current.

Nanosheet field-effect transistors have been developed as a type of non-planar field-effect transistor that may permit additional increases in packing density in an integrated circuit. A nanosheet field-effect transistor includes multiple nanosheet channel layers that are arranged in a layer stack and source/drain regions connected with the ends of the nanosheet channel layers. The nanosheet channel layers are initially arranged in the layer stack with sacrificial layers containing a material (e.g., silicon-germanium) that alternate with the nanosheet channel layers and that can be etched selectively to the material (e.g., silicon) constituting the nanosheet channel layers. The sacrificial layers are etched and removed in order to release the nanosheet channel layers and to provide spaces for the formation of the sections of a gate stack. Sections of the gate stack may surround all sides of the individual nanosheet channel layers in a gate-all-around arrangement. When a control voltage exceeding a designated threshold voltage is applied to the gate stack, the horizontal flow of carriers in the nanosheet channel layers produces a device output current.

Before the source/drain regions and gate stack are formed, the sacrificial layers are recessed to form divots or indents in the layer stack. The indents are filled with a dielectric material to define inner spacers that eventually isolate the gate stack from the source/drain regions. Conventionally, a conformal layer is deposited that pinches off inside the indents to form the inner spacers. A dielectric etch back is performed to remove excess dielectric material of the conformal layer from the ends of the nanosheet channel layers, which is needed for the subsequent epitaxial growth of the source/drain regions. As the pitch of the gate stacks of nanosheet field-effect transistors is scaled downward, the deposited conformal layer may pinch off and occlude the narrowed space between the gate stack on adjacent layer stacks of nanosheet channel layers. If this space is occluded, the inners spacers cannot be reliably formed.

SUMMARY

In embodiments of the invention, a method is provided for forming a field-effect transistor. The method includes epitaxially growing a layer stack including a plurality of nanosheet channel layers and a plurality of sacrificial layers arranged to alternate with the plurality of nanosheet channel layers. First and second gate structures are formed that extend across the layer stack and that are separated by a first gap. The method further includes forming a first sidewall spacer and a second sidewall spacer over the layer stack and within the first gap respectively adjacent to the first gate structure and the second gate structure. After forming the first sidewall spacer and the second sidewall spacer, the layer stack is etched to form a first body feature and a second body feature separated from the first body feature by a second gap. The method further includes recessing the plurality of sacrificial layers relative to the plurality of nanosheet channel layers to define a plurality of indents in the first body feature and the second body feature. After recessing the plurality of sacrificial layers, the first sidewall spacer and the second sidewall spacer are removed. The method further includes, after removing the first sidewall spacer and the second sidewall spacer, depositing a conformal layer in the second gap that fills the plurality of indents to define a plurality of inner spacers.

In embodiments of the invention, a method is provided for forming a field-effect transistor. The method includes forming a layer stack including a plurality of nanosheet channel layers and a plurality of sacrificial layers arranged to alternate with the nanosheet channel layers, forming a gate structure extending across the layer stack, and forming a sidewall spacer adjacent to the gate structure. After forming the first sidewall spacer, the layer stack is etched to form a body feature. The method further includes recessing the sacrificial layers relative to the nanosheet channel layers to define a plurality of indents in the body feature. After recessing the sacrificial layers, the first sidewall spacer is removed, and a conformal layer is deposited over the body feature and the gate structure that fills the indents to define a plurality of inner spacers.

In embodiments of the invention, a structure is provided for a field-effect transistor. The structure includes a plurality of nanosheet channel layers arranged in a layer stack, a source/drain region connected with the nanosheet channel layers, and a gate structure including a plurality of sections that respectively surround the nanosheet channel layers. The structure further includes a first sidewall spacer arranged adjacent to the gate structure, and a second sidewall spacer arranged adjacent to the gate structure. The second sidewall spacer is arranged over the first sidewall spacer in a stacked arrangement. The first sidewall spacer is comprised of a first low-k dielectric material, and the second sidewall spacer is comprised of a second low-k dielectric material different in composition from the first low-k dielectric material

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
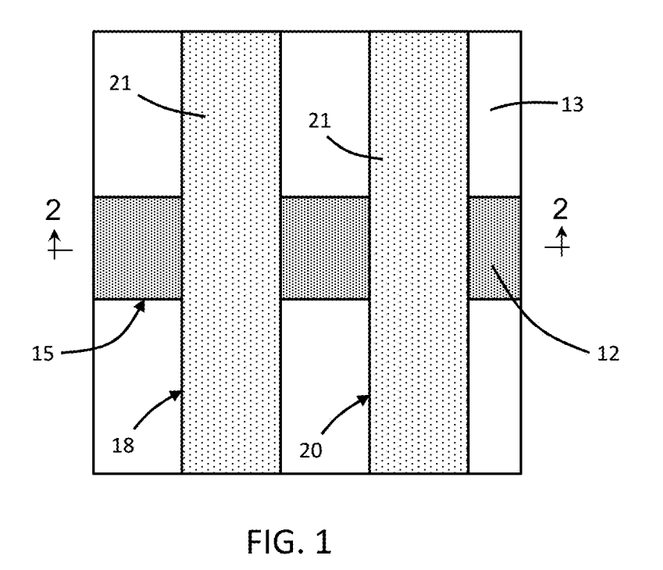
FIG. 1 is a top view of a device structure at an initial fabrication stage of the processing method in accordance with embodiments of the invention.
Figure 2:
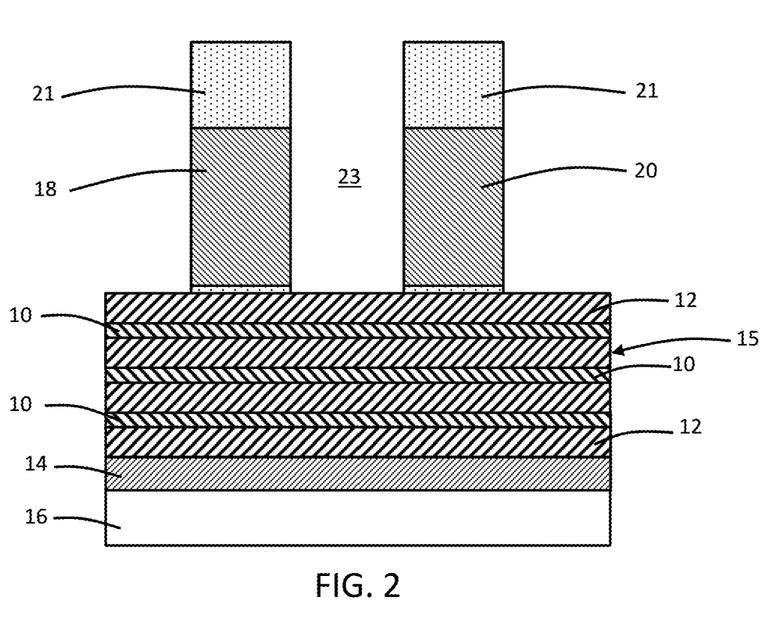
FIG. 2 is a cross-sectional view taken generally along line 2-2 in FIG. 1.

With reference to FIGS. 1, 2 and in accordance with embodiments of the invention, nanosheet channel layers 10, sacrificial layers 12, and a sacrificial layer 14 are arranged in patterned layer stack 15 on a substrate 16. The substrate 16 may be composed of a semiconductor material, such as single-crystal silicon. Shallow trench isolation regions 13 may be arranged about the patterned layer stack 15. The nanosheet channel layers 10 and sacrificial layers 12, 14 may be formed on the substrate 16 by an epitaxial growth process during which the composition is alternated through variation of the reactants supplied to the deposition tool. The nanosheet channel layers 10 and sacrificial layers 12, 14 may be patterned after growth using lithography and etching processes to form the layer stack 15. The number of nanosheet channel layers 10 and sacrificial layers 12 in the layer stack 15 may differ from the number in the depicted representative embodiment and, in particular, may be greater than the number in the representative embodiment through the addition of pairs of nanosheet channel layers 10 and sacrificial layers 12 to the layer stack 15.

The nanosheet channel layers 10 are composed of a semiconductor material, and the sacrificial layers 12 are composed of a semiconductor material with a composition that is selected to be removed selective to the semiconductor material of the nanosheet channel layers 10. The sacrificial layer 14 is composed of a semiconductor material with a composition that is selected to be removed selective to the semiconductor materials of both the nanosheet channel layers 10 and sacrificial layers 12. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

In an embodiment, the semiconductor material constituting the nanosheet channel layers 10 may be silicon (Si), the semiconductor material constituting the sacrificial layers 12 may be silicon-germanium (SiGe) that etches at a higher rate than silicon due to the germanium content, and the semiconductor material constituting the sacrificial layer 14 may be silicon-germanium (SiGe) that etches at a higher rate than the sacrificial layers 12 due to a higher germanium content. In an embodiment, the germanium content of the sacrificial layers 12 may range from fifteen atomic percent (15 at. %) to thirty-five atomic percent (35 at. %), and the germanium content of the sacrificial layer 14 may range from fifty atomic percent (50 at. %) to seventy-five atomic percent (75 at. %).

Sacrificial gate structures 18, 20 are formed that overlap with and wrap around the patterned layer stack 15. The term "sacrificial gate structure" as used herein refers to a placeholder structure for a gate structure to be subsequently formed. The sacrificial gate structures 18, 20 have a spaced-apart arrangement along the length of the layer stack 15 and are aligned transverse to the layer stack 15. In particular, the sacrificial gate structures 18, 20 are spaced apart by a gap 23.

The sacrificial gate structures 18, 20 may include a thin layer containing, for example, silicon dioxide arranged adjacent to the layer stack 15 and a thick layer containing, for example, amorphous silicon over the thin layer. The sacrificial gate structures 18, 20 are patterned from these constituent layers with reactive ion etching (RIE) using a hardmask. The sacrificial gate structures 18, 20 may be cut along their lengths to define the locations of individual field-effect transistors and/or the sacrificial gate structures 18, 20 may overlap with additional layer stacks similar to layer stack 15. The sacrificial gate structures 18, 20 are covered by a hardmask cap 21 arranged on their respective top surfaces. The hardmask cap 21 may include one or more dielectric materials, such as a layered combination of silicon dioxide over silicon nitride, and may be a remnant of the hardmask from the lithography and etching processes used to form the sacrificial gate structures 18, 20.

Figure 3:
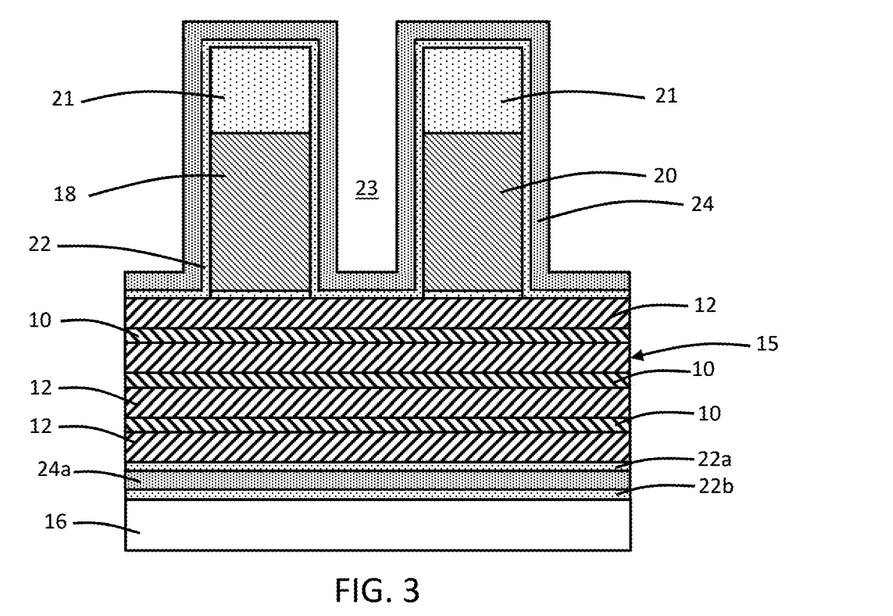
FIGS. 3-13 are cross-sectional views of the device structure at successive fabrication stages of the processing method subsequent to FIG. 2.

With reference to FIG. 3 in which like reference numerals refer to like features in FIG. 2 and at a subsequent fabrication stage of the processing method, the sacrificial layer 14 is removed by an etching process selective to the nanosheet channel layers 10 and the sacrificial layers 12. After removing the sacrificial layer 14, a conformal dielectric liner 22 and a conformal dielectric layer 24 are sequentially formed on the sacrificial gate structures 18, 20 and their hardmask caps 21, as well as on surfaces of the uppermost sacrificial layer 12 between the sacrificial gate structures 18, 20. In an embodiment, the dielectric liner 22 may be composed of silicon dioxide ($SiO_2$) deposited by atomic layer deposition (ALD), and the dielectric layer 24 may be composed of silicon-boron-carbon nitride (SiBCN) deposited by atomic layer deposition.

The dielectric material of the dielectric liner 22 also forms inside the cavity generated by the removal of the sacrificial layer 14 on the sacrificial layer 12 as a dielectric layer 22a and on the substrate 16 as a dielectric layer 22b. The dielectric material of the dielectric layer 25 also forms as a dielectric layer 24a that fills the remaining space inside the cavity between the dielectric layers 22a, 22b.

Figure 4:
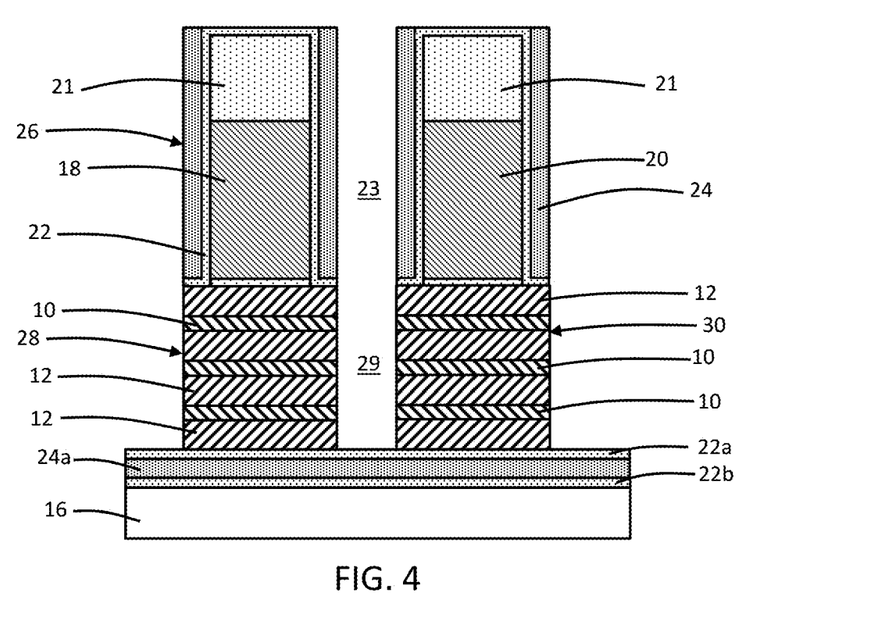

With reference to FIG. 4 in which like reference numerals refer to like features in FIG. 3 and at a subsequent fabrication stage of the processing method, bilayer sidewall spacers 26 are formed at the sidewalls of the sacrificial gate structures 18, 20 by etching the dielectric liner 22 and dielectric layer 24 with a directional etching process, such as reactive ion etching. The dielectric liner 22 provides an L-shaped component of the bilayer sidewall spacers 26, and the dielectric layer 24 provides the outermost component of the bilayer sidewall spacers 26. The gap 23 between the sacrificial gate structures 18, 20 is narrowed by the formation of the bilayer sidewall spacers 26.

The nanosheet channel layers 10 and sacrificial layers 12 are patterned to form body features 28, 30 that each include one of the layer stacks 15 of patterned nanosheet channel layers 10 and sacrificial layers 12. The body features 28, 30 may be formed by a self-aligned etching process in which the respective sacrificial gate structures 18, 20 and bilayer sidewall spacers 26 effectively operate as an etch mask. The self-aligned etching process, which may be a reactive ion etching process, may utilize one or more etch chemistries to etch the nanosheet channel layers 10 and sacrificial layers 12, and may stop on the dielectric layer 22a. The body features 28, 30 are separated from each other by a gap 29 after the patterning is completed. Due to the self-alignment, the gap 29 is equal or substantially equal to the gap 23.

Figure 5:
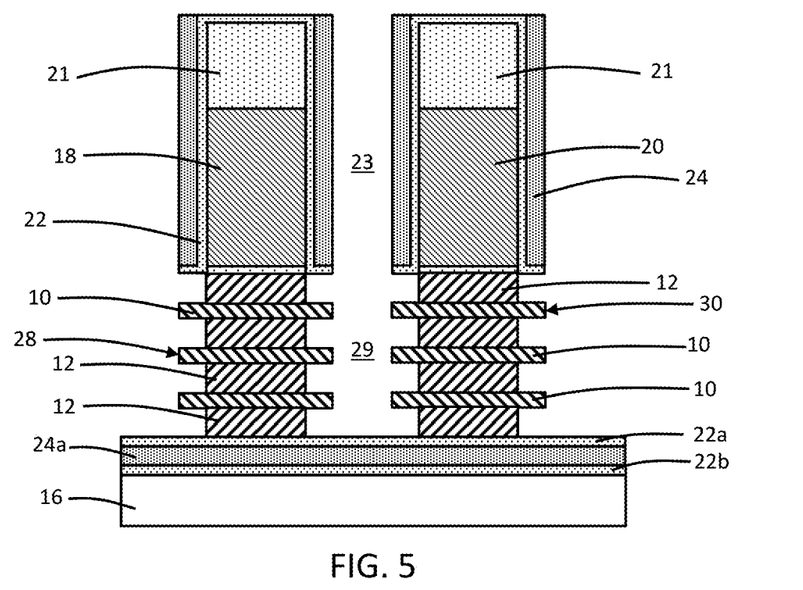

With reference to FIG. 5 in which like reference numerals refer to like features in FIG. 4 and at a subsequent fabrication stage of the processing method, the sacrificial layers 12 are laterally recessed relative to the nanosheet channel layers 10 with a dry or wet isotropic etching process that etches the semiconductor material constituting the sacrificial layers 12 selective to the semiconductor material constituting the nanosheet channel layers 10. The lateral recessing of the sacrificial layers 12 generates indents 32 in the sidewalls of the body features 28, 30 because the nanosheet channel layers 10 are not laterally recessed due to the etch selectivity of the isotropic etching process. In an embodiment, the sacrificial layers 12 may be laterally recessed using a mixture of water ($H_2O$), hydrogen peroxide ($H_2O_2$), and ammonium hydroxide ($NH_4OH$) (i.e., a wet SC1 clean).

Figure 6:
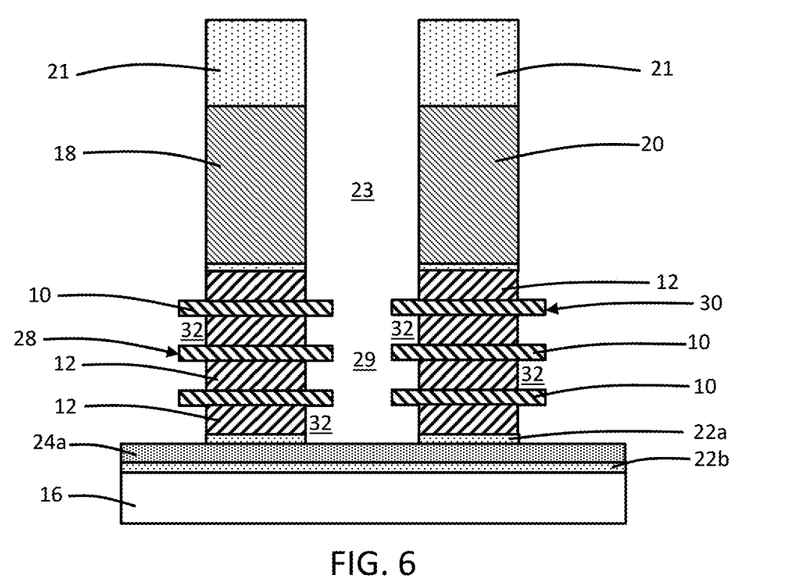

With reference to FIG. 6 in which like reference numerals refer to like features in FIG. 5 and at a subsequent fabrication stage of the processing method, the bilayer sidewall spacers 26 are removed with one or more etching processes to expose the sidewalls of the sacrificial gate structures 18, 20. The dielectric layer 22a masks and protects underlying portions of the dielectric layer 24a during the etching process removing the dielectric layer 24 of the bilayer sidewall spacers 26. Portions of the dielectric layer 22a exposed by the removal of dielectric layer 24 are subsequently removed by the etching process removing the dielectric liner 22 of the bilayer sidewall spacers 26. The removal of the bilayer sidewall spacers 26, which are sacrificial, contrasts with a conventional process flow in which inner spacers are formed in the indents 32 with sidewall spacers in place adjacent to the sacrificial gate structures 18, 20. The removal of the bilayer sidewall spacers 26 increased the width of the gap 29 between the sacrificial gate structures 18, 20.

Figure 7:
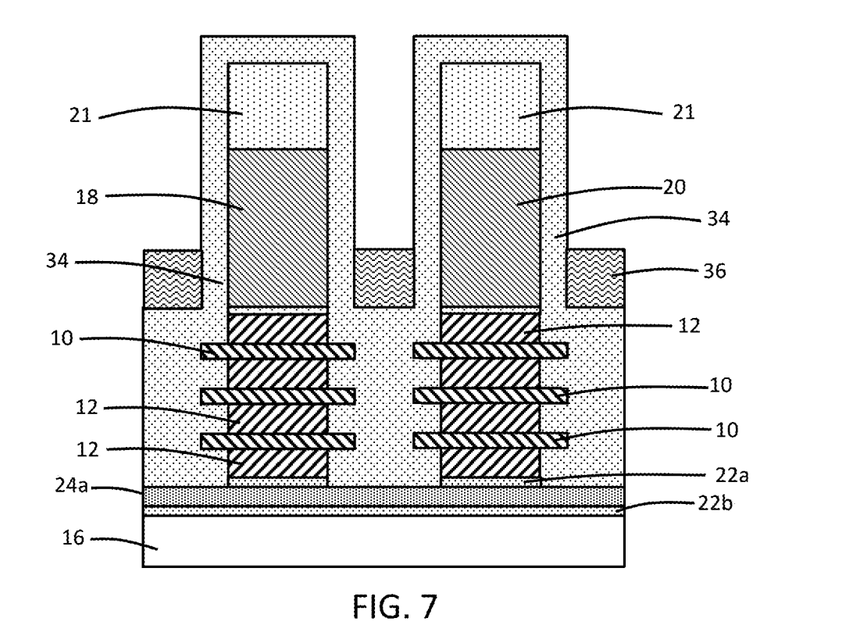

With reference to FIG. 7 in which like reference numerals refer to like features in FIG. 6 and at a subsequent fabrication stage of the processing method, a conformal layer 34 composed of a low-k dielectric material, such as carbon-doped silicon oxide (SiCO), is deposited by atomic layer deposition and fills the gap 29 between the body features 28, 30. A low-k dielectric material is characterized by a relative permittivity or dielectric constant that is less than the dielectric constant of silicon dioxide, which is about 3.9. The conformal layer 34 fills the indents 32 in the sidewalls of the body features 28, 30 by pinch-off. The conformal layer 34 also coats the sacrificial gate structures 18, 20 and their hardmask caps 21. The prior removal of the bilayer sidewall spacers 26 effectively widens the gap 23 between the sacrificial gate structures 18, 20 to promote improved filling of the gap 29 between the body features 28, 30 and to prevent pinch-off inside the gap 23 during deposition of the conformal layer 34.

An etch mask 36 is applied and recessed with an etching process. The etch mask 36 may include material from an organic planarization layer (OPL) that is applied as a spin-on hardmask. The recessed etch mask 36 has a height that is a fraction of the height of the sacrificial gate structures 18, 20.

Figure 8:
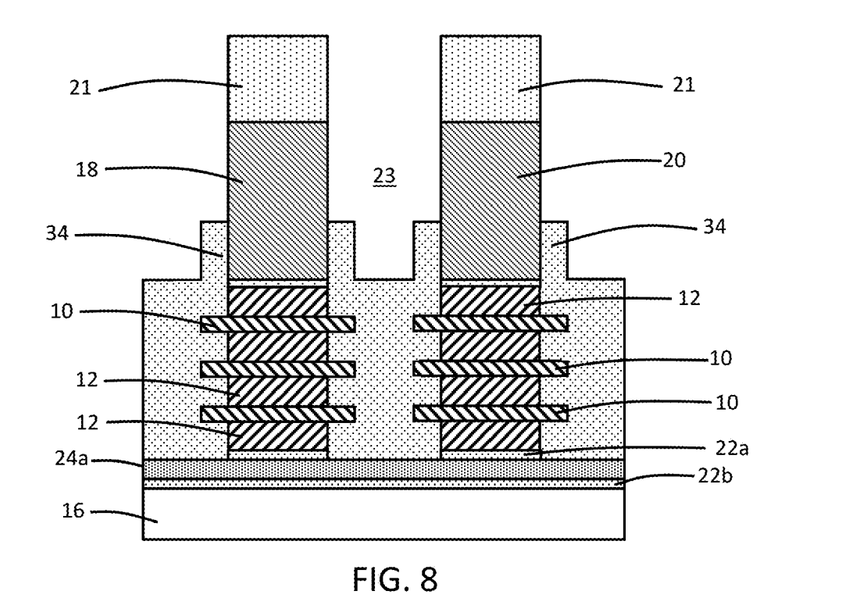

With reference to FIG. 8 in which like reference numerals refer to like features in FIG. 7 and at a subsequent fabrication stage of the processing method, an etching process is used to chamfer the conformal layer 34 to the height of the recessed etch mask 36. The etching process may be performed by wet chemical etching or dry reactive ion etching. Following the conclusion of the etching process, the etch mask 36 may be removed by, for example, ashing using an oxygen-based plasma.

Figure 9:
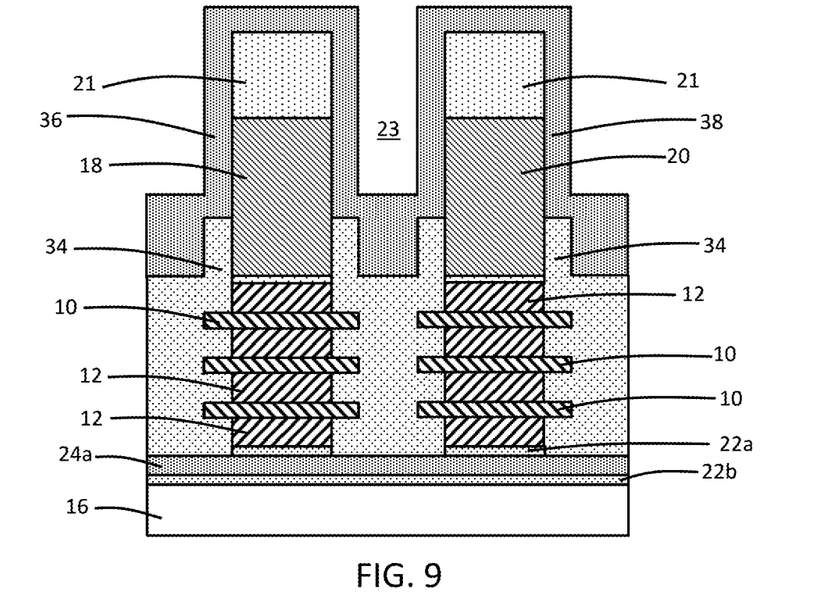

With reference to FIG. 9 in which like reference numerals refer to like features in FIG. 8 and at a subsequent fabrication stage of the processing method, a conformal layer 38 composed of a low-k dielectric material, such as silicon-boron-carbon nitride (SiBCN), is deposited by atomic layer deposition. The conformal layer 38 coats the portions of the sacrificial gate structures 18, 20 and their hardmask caps 21 exposed by the chamfering of the conformal layer 34, and covers the conformal layer 34 residing in the gap 29 between the body features 28, 30. The dielectric material of conformal layer 38 is chosen to have etch selectivity relative to the dielectric material of conformal layer 34.

Figure 10:
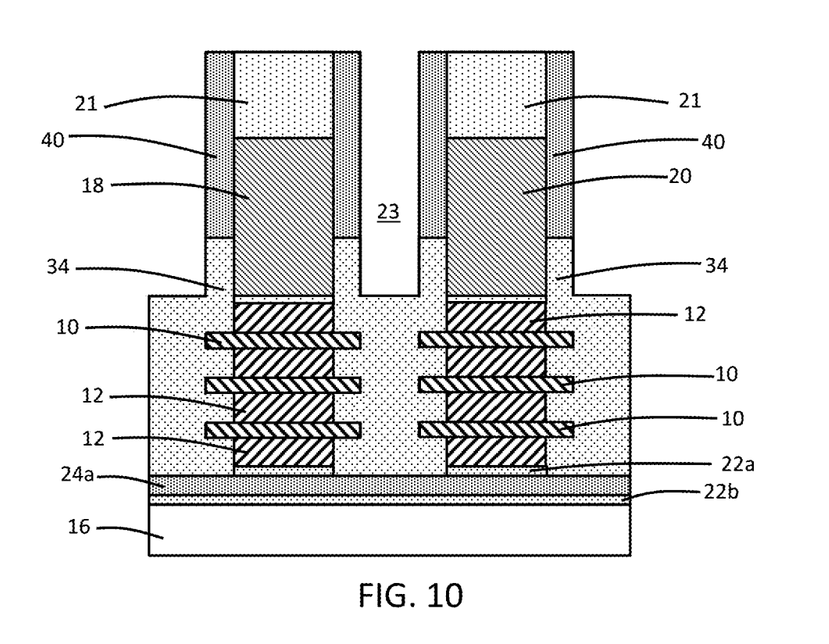

With reference to FIG. 10 in which like reference numerals refer to like features in FIG. 9 and at a subsequent fabrication stage of the processing method, upper sidewall spacers 40 are formed at the sidewalls of the sacrificial gate structures 18, 20 by etching the conformal layer 38 with a directional etching process, such as an anisotropic reactive ion etching process. The etching process removes the dielectric material of the conformal layer 38 selective to the dielectric material of the conformal layer 34.

Figure 11:
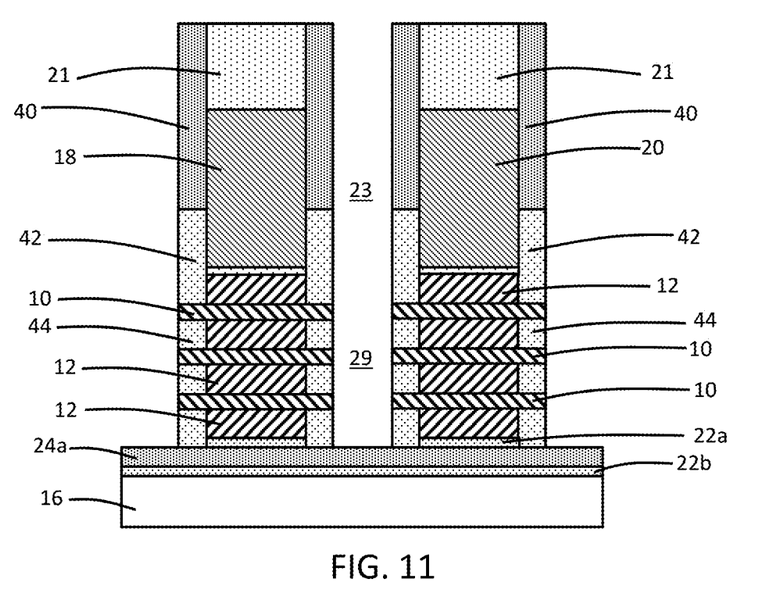

With reference to FIG. 11 in which like reference numerals refer to like features in FIG. 10 and at a subsequent fabrication stage of the processing method, lower sidewall spacers 42 are formed at the sidewalls of the sacrificial gate structures 18, 20 by etching the conformal layer 34 with a directional etching process, such as an anisotropic reactive ion etching process. The etching process removes the dielectric material of the conformal layer 34 selective to the dielectric material of the conformal layer 38, and the upper sidewall spacers 40 effectively provide an etch mask for self-aligned formation of the lower sidewall spacers 42. The upper sidewall spacers 40 are arranged over the lower sidewall spacers 42 adjacent to the sidewalls of the sacrificial gate structures 18, 20, and the upper sidewall spacers 40 are stacked over (i.e., placed on top of) the lower sidewall spacers 42. Due to etch selectivity between their dielectric materials, the upper sidewall spacers 40 are not pulled down to a significant extent by the etching process forming the lower sidewall spacers 42. In addition, the upper sidewall spacers 40 and lower sidewall spacers 42 are formed without the necessity of a wet chemical etch as is conventional.

The etching process also forms inner spacers 44 in the indents in the sidewalls of the body features 28, 30. The formation of the inner spacers 44 occurs later than in conventional process flows, and the inner spacers 44 are composed of a low-k dielectric material instead of silicon nitride or silicon oxide.

Figure 12:
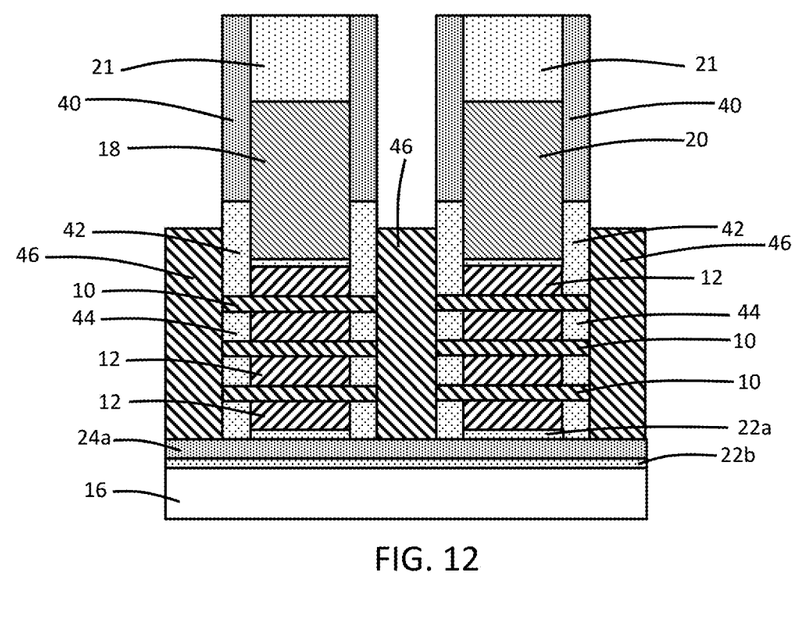

With reference to FIG. 12 in which like reference numerals refer to like features in FIG. 11 and at a subsequent fabrication stage of the processing method, source/drain regions 46 are formed adjacent to the side surfaces of each of the body features 28, 30. As used herein, the term "source/drain region" means a doped region of semiconductor material that can function as either a source or a drain of a field-effect transistor. The source/drain regions 46 are directly connected with the nanosheet channel layers 10 and are physically isolated from the sacrificial layers 12 by the inner spacers 44.

The source/drain regions 46 may be formed by an epitaxial growth process in which single-crystal semiconductor material grows laterally from growth seeds provided by the nanosheet channel layers 10. The single-crystal semiconductor material of the source/drain regions 46 has an epitaxial relationship with the single-crystal semiconductor material of the nanosheet channel layers 10. The semiconductor material constituting the source/drain regions 46 may be heavily doped to have either p-type electrical conductivity or n-type electrical conductivity depending on the type of field-effect transistor. In an embodiment, the source/drain regions 46 may be formed by a selective epitaxial growth (SEG) process in which semiconductor material nucleates for epitaxial growth on single crystal surfaces (e.g., the nanosheet channel layers 10), but does not nucleate for epitaxial growth from insulator surfaces.

Figure 13:
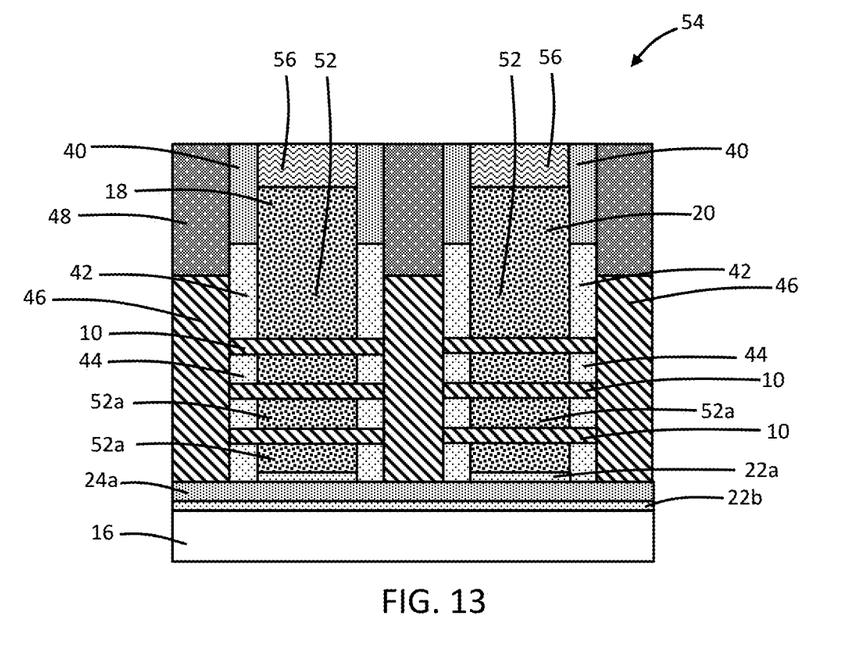

With reference to FIG. 13 in which like reference numerals refer to like features in FIG. 12 and at a subsequent fabrication stage of the processing method, a gap-fill layer 48 is deposited and planarized to fill space between the sacrificial gate structures 18, 20 and semiconductor over the source/drain regions 46. The gap-fill layer 48 may be composed of a dielectric material, such as silicon dioxide ($SiO_2$), deposited by chemical vapor deposition (CVD) and may be planarized by chemical-mechanical polishing (CMP). The planarization removes the hardmask cap 21 to reveal the sacrificial gate structures 18, 20 and shortens the height of the sacrificial gate structures 18, 20 and the upper sidewall spacers 40.

The sacrificial gate structures 18, 20 are removed with one or more etching processes. The sacrificial layers 12 are subsequently removed with an etching process that removes the material of the sacrificial layers 12 selective to the materials of the nanosheet channel layers 10 and inner spacers 44. The etching process may be, for example, a wet SC1 clean or a dry vapor-phase hydrochloric acid (HCl) etch. The removal of the sacrificial layers 12 releases the nanosheet channel layers 10 and opens spaces surrounding the nanosheet channel layers 10 of each of the body features 28, 30. The inner spacers 44 and gap-fill layer 48 function to mask the source/drain regions 46 from the etching process removing the sacrificial layers 12. The nanosheet channel layers 10 are anchored at opposite ends between the inner spacers 44.

Gate structures 52 are formed in the spaces opened by the removal of the sacrificial gate structures 18, 20 and sacrificial layers 12 to complete the formation of a field-effect transistor 54 in a replacement gate process. The gate structures 52 may include an interface layer coating the nanosheet channel layers 10, a gate dielectric layer composed of a dielectric material, such as a high-k dielectric, and a metal gate electrode composed of one or more barrier metal layers and/or work function metal layers, such as titanium aluminum carbide (TiAlC) or titanium nitride (TiN), and a metal gate fill layer that is comprised of a conductor, such as tungsten (W). The interface layer and gate dielectric layer are arranged between the gate electrode and the exterior surface of the nanosheet channel layers 10.

Self-aligned contact (SAC) caps 56 composed of a dielectric material, such as silicon nitride ($Si_3N_4$), are formed in the spaces between the upper sidewall spacers 40 and over each of the gate structures 52. The gap-fill layer 48 may be removed and trench silicide contacts (not shown) may be formed in the opened spaces that extend to contact the source/drain regions 46. Middle-of-line (MOL) and back-end-of-line (BEOL) processing are subsequently used to form an interconnect structure that is coupled with the field-effect transistor 54.

The nanosheet channel layers 10 of the field-effect transistor 54 are arranged in a vertical stack and sections 52a of each gate structure 52 are located in the spaces formerly occupied by the removed sacrificial layers 12. The sections 52a of each gate structure 52 may surround an exterior surface of the nanosheet channel layers 10 in a gate-all-around arrangement. The nanosheet channel layers 10 function as channels for carrier flow that are formed during operation of the field-effect transistor 54.

In an alternative embodiment, the dielectric materials of the upper sidewall spacers 40 and lower sidewall spacers 42 in the stacked arrangement may be swapped such that the upper sidewall spacers 40 are composed of carbon-doped silicon oxide (SiCO), and the lower sidewall spacers 42 are composed of silicon-boron-carbon nitride (SiBCN). The dielectric materials of the upper sidewall spacers 40 and lower sidewall spacers 42 may be varied so long as etch selectivity between the dielectric materials is maintained. For example, one of the dielectric materials may be an oxide-based low-k dielectric material (e.g., carbon-doped silicon oxide) and the other of the dielectric materials may be a nitride-based low-k dielectric material (e.g., silicon-boron-carbon nitride). Changes to the composition of the dielectric materials of the sidewall spacers 40, 42 (i.e., the conformal dielectric layers 34, 38) will also result in a concomitant change to the composition of the dielectric materials forming the dielectric layers 22a, 22b, 24a.

The inner spacers 44 are composed of a low-k dielectric material, which may be effective to reduce the capacitance between the gate structures 52 and the trench silicide contacts and source/drain regions 46 during operation of the field-effect transistor 54. The inner spacers 44 are composed of the same dielectric material as the lower sidewall spacers 42, and a change in the dielectric material providing the lower sidewall spacers 42 will also change the dielectric material constituting the inner spacers 44 because each is formed from the same conformal layer 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:

a plurality of nanosheet channel layers arranged in a layer stack, the plurality of nanosheet channel layers comprised of a first single-crystal semiconductor material;

a source/drain region connected with the plurality of nanosheet channel layers, the source/drain region comprised of a second single-crystal semiconductor material having an epitaxial relationship with the first single-crystal semiconductor material of the plurality of nanosheet channel layers;

a gate structure including a plurality of sections that respectively surround the plurality of nanosheet channel layers;

a first dielectric layer arranged beneath the plurality of nanosheet channel layers and the source/drain region;

a second dielectric layer arranged beneath the plurality of nanosheet channel layers and only between the first dielectric layer and the plurality of nanosheet channel layers;

a first sidewall spacer arranged adjacent to the gate structure; and a second sidewall spacer arranged adjacent to the gate structure, the second sidewall spacer positioned over the first sidewall spacer in a stacked arrangement, wherein the first sidewall spacer is comprised of a first low-k dielectric material, the second sidewall spacer is comprised of a second low-k dielectric material different in composition from the first low-k dielectric material, and the first dielectric layer is comprised of a third low-k dielectric material.

2. The structure of claim 1 further comprising:
a plurality of inner spacers positioned in the layer stack between respective pairs of the plurality of nanosheet channel layers,
wherein the plurality of inner spacers are comprised of the first low-k dielectric material, and the plurality of inner spacers separate the source/drain region from the plurality of sections of the gate structure.

3. The structure of claim 1 wherein the first low-k dielectric material is an oxide-based dielectric material, and the second low-k dielectric material is a nitride-based dielectric material.

4. The structure of claim 1 wherein the first low-k dielectric material is silicon-boron-carbon nitride (SiBCN), and the second low-k dielectric material is carbon-doped silicon oxide (SiCO).

5. The structure of claim 1 wherein the first low-k dielectric material is a nitride-based dielectric material, and the second low-k dielectric material is an oxide-based dielectric material.

6. The structure of claim 1 wherein the first low-k dielectric material is carbon-doped silicon oxide (SiCO), and the second low-k dielectric material is silicon-boron-carbon nitride (SiBCN).

7. The structure of claim 1 wherein the first low-k dielectric material is silicon-boron-carbon nitride (SiBCN) or carbon-doped silicon oxide (SiCO).

8. The structure of claim 1 further comprising:
a third dielectric layer,
wherein the first dielectric layer is positioned between the second dielectric layer and the third dielectric layer.

9. The structure of claim 8 wherein the second dielectric layer and the third dielectric layer are comprised of silicon dioxide.

10. The structure of claim 9 wherein the third low-k dielectric material is silicon-boron-carbon nitride (SiBCN).

11. The structure of claim 10 wherein the first low-k dielectric material is silicon-boron-carbon nitride (SiBCN).

12. The structure of claim 10 wherein the second low-k dielectric material is silicon-boron-carbon nitride (SiBCN).

* * * * *